United States Patent [19]

Weiss

[11] Patent Number: 4,712,025

[45] Date of Patent: Dec. 8, 1987

[54] ANALOG SWITCH

[75] Inventor: Frederick G. Weiss, Portland, Oreg.

[73] Assignee: Triquint Semiconductor, Inc., Beaverton, Oreg.

[21] Appl. No.: 727,483

[22] Filed: Apr. 26, 1985

[51] Int. Cl.[4] .................. H03K 17/16; H03K 17/687
[52] U.S. Cl. .................................. 307/571; 307/572; 307/296 R
[58] Field of Search .............. 307/571, 572, 577, 582, 307/480, 296 R

[56] References Cited

U.S. PATENT DOCUMENTS

| | | | |
|---|---|---|---|
| 3,586,880 | 6/1971 | Fitzwater, Jr. | 307/572 |
| 3,610,953 | 10/1971 | Gordon et al. | 307/571 |
| 4,323,796 | 4/1982 | Lathrope | 307/572 |

Primary Examiner—John Zazworsky
Attorney, Agent, or Firm—John D. Winkelman; William S. Lovell; John Smith-Hill

[57] ABSTRACT

The source and drain of a first depletion-mode MES-FET (DFET) define the controlled current path of a switch, the switch being open or closed depending on whether the gate-to-source voltage ($V_{gs}$) for the first DFET is greater or less than the pinch-off voltage ($V_p$) for the first DFET. The first DFET has its gate connected to a first circuit node. A second DFET, connected as a source follower, has its gate connected to the source of the first DFET. A first diode has its anode connected to the first circuit node and its cathode connected to a second circuit node. A second diode has its cathode connected to the second circuit node and its a node connected to the source of the second DFET. At least one additional diode is connected anti-parallel to the first diode between the first and second nodes. A constant current source draws current either through the first diode or through the additional diode(s) in dependence upon the state of a control signal applied to a current steering network connected across the first diode.

12 Claims, 3 Drawing Figures

ANALOG SWITCH

This invention relates to an analog switch.

BACKGROUND OF THE INVENTION

Analog (or solid state) switches are widely used in electronic circuits to control flow of current from an input terminal of the switch to an output terminal of the switch in dependence on a digital control signal. Such a switch may comprise, as its switching element, a field-effect transistor, e.g. a metal-oxide-semiconductor field-effect transistor (MOSFET) or a junction field-effect transistor (JFET), having its source connected to the input terminal, its drain connected to the output terminal and its gate connected to a driver circuit that receives the control signal. As shown in "Analog Switches and Their Applications", published by Siliconix incorporated, 1976, at page 2–3, the driver circuit, in its simplest form, may comprise a bipolar transistor or a FET.

In order to provide a high switching speed while minimizing bleeding of current from the analog signal path, a diode may be interposed between the collector of the driver circuit's bipolar transistor and the gate of the FET switching element. When the switch is closed, the diode conducts only the gate leakage current of the FET switching element, whereas when the switch is open it conducts only the reverse diode leakage current.

A switch topology that may be implemented with junction MESFET technology is described in W. E. Hall, "Design of a Radiation Hardened GaAs Band Gap Reference", Proceedings of 1984 GOMAC Conference, 1984, pages 443–447. This switch is shown in FIG. 1 of the accompanying drawings, and comprises a junction MESFET 22, which is the actual switch element, a source follower transistor 24, a current source 26 that supplies tail current for the transistor 24, a resistor 28 connected to the gate of the transistor 22, a level shift string 30 connected between the resistor 28 and the current source 26, and a transistor 32 that switches control current $I_{ctrl}$ in dependence on the control voltage $\phi$. When the control voltage $\phi$ is low, the transistor 32 is non-conductive and the voltage on the gate of the transistor 22 follows that on the source of the transistor 24, with a level shift due to the level shift string 30. The level shift is set so that the gate of the transistor 22 follows the source of that transistor (via the source follower action of the transistor 24) in such a way as to maintain the transistor 22 in its conductive state, i.e. closed, without forward-biasing the gate-to-channel junction of the transistor 22 and thus perturbing the signal path with charge injected from the driver circuit. When the control voltage $\phi$ goes high, the transistor 32 turns on and the additional current drawn through the resistor 28 causes the potential at the gate of the transistor 22 to fall sufficiently to turn the transistor 22 off, thus opening the switch. (In this specification, a switch that is described as being closed or on is conductive, providing a current path from its input terminal to its output terminal, whereas one that is described as being open or off is non-conductive, preventing flow of current.)

The circuit shown in FIG. 1 is subject to certain disadvantages. In particular, the circuit is limited to unipolar operation, i.e. the input signal applied to the transistor 22 must be at a positive potential, since the sources of the transistors 26 and 32 are both grounded. Since the control current $I_{ctrl}$ is switched on and off to effect the switching action, the power supply current will exhibit substantial variations, which can result in significant power supply noise and perturbation of the analog signal path via secondary peripheral paths. The voltage variation at the gate of the transistor 22 can change the current through the level shift string 30 by a significant amount, resulting in a variation of like magnitude but opposite sign in the current flowing in the source follower transistor 24, and this variation in current through the transistor 24 will increase the time required for the voltage at the source of the transistor 24 to stabilize after the switch is closed. Finally, the fact that the current flowing in the source follower transistor 24 is subject to change implies that the voltage at its source will also change, and this change in voltage will couple through the gate-to-source capacitance of the transistor 24 and perturb the analog signal at the source of the transistor 22.

SUMMARY OF THE INVENTION

In a preferred embodiment of the invention, the source and drain of a first depletion-mode MESFET (DFET) define the controlled current path of a switch, the switch being open or closed depending on whether the gate-to-source voltage ($V_{gs}$) for the first DFET is greater or less than the pinch-off voltage ($V_p$) for the first DFET. The first DFET has its gate connected through a second DFET having its gate and source interconnected and acting as a resistive load to a positive potential source. The gate of the first DFET is also connected to a first circuit node. A third DFET, connected as a source follower, has its drain connected to the positive potential source and its gate connected to the source of the first DFET. A first diode has its anode connected to the first circuit node and its cathode connected to a second circuit node. A second diode has its cathode connected to the second circuit node and its anode connected to the source of the third DFET. At least one additional diode is connected anti-parallel to the first diode between the first and second nodes. A constant current source draws current either through the first diode or through the additional diode(s) in dependence upon the state of a control signal applied to a current steering network connected across the first diode. The difference between the current flowing in the second DFET load and the constant current source flows through the source follower, and is chosen so as to bias the follower at or near $V_{gs}=0$, independent of the state of the control signal.

If current is drawn through the first diode, an about equal current is drawn through the second diode and the result is that $V_{gs}$ for the first DFET is kept at or below zero (depending on the relative widths of the second and third DFETs and the current drawn by the constant current source) and the switch is on. If current is drawn through the additional diode(s), the potential drop across the additional diode(s) is such that $V_{gs}$ for the first DFET is less than $V_p$ and the switch is therefore off. The source follower senses the potential of the source of the first DFET and prevents the gate-to-source junction of the first DFET from becoming forward biased, and thereby prevents any ohmic interaction between the driver circuit and the controlled current path.

BRIEF DESCRIPTION OF THE DRAWING

For a better understanding of the invention, and to show how the same may be carried into effect, reference will now be made, by way of example, to the accompanying drawing in which.

DETAILED DESCRIPTION

Figure 2:
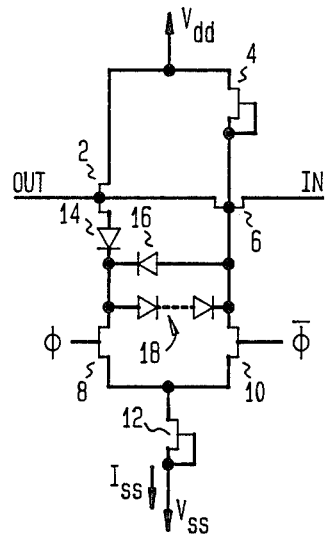
FIG. 2 is a schematic diagram of an analog switch embodying the present invention.
Figure 3:
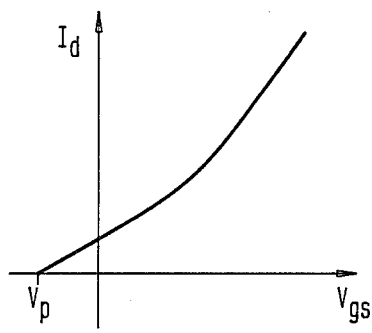
FIG. 3 is a graph of current against voltage to aid in explaining operation of the FIG. 2 switch.

The circuit shown in FIG. 2 comprises depletion-mode field effect transistors 2, 4, 6, 8, 10 and 12. The DFET's characteristic curve for drain current $I_d$ as a function of the gate-source voltage $V_{gs}$ is as shown in FIG. 3, i.e. drain current flows so long as $V_{gs}$ exceeds a negative pinch-off voltage $V_p$, and for values of $V_{gs}$ greater than $V_p$, drain current increases as $V_{gs}$ increases.

The transistor 2 is connected as a source follower, so that the source potential of the transistor 2 follows its gate potential when the device is biased such that a current flows between its source and drain terminals.

When the control voltage $\phi$ is high (and $\overline{\phi}$ is low) the transistor 8 is conductive and the transistor 10 is non-conductive. The current $I_{ss}$ drawn by the transistor 12, acting as a constant current source, passes through the transistor 8 and flows in part through the diode 14 and the source follower transistor 2 and in part through the diode 16 and the pull-up transistor 4. The gate of the transistor 6 is consequently at the same potential as the source and gate of the transistor 2. The gate of the transistor 6 is thus at the same potential as its source, and consequently the transistor 6 is conductive and the switch is closed.

When the control voltage $\phi$ is low, the transistor 8 is non-conductive and the transistor 10 is conductive, and consequently $I_{ss}$ is steered to flow through the transistor 10. The current flowing through transistor 10 is divided between the diode string 18 and the transistor 2 on the one hand and the transistor 4 on the other hand. The diode drops interposed in the path of the current from the source of the transistor 2 ensures that the potential at the gate of the transistor 6 is below the potential at the source of that transistor. By selecting the number of diodes in the string 18, $V_{gs}$ for the transistor 6 can be brought below $V_p$, thus ensuring that the transistor 6 is off and that the switch is open.

Figure 1:
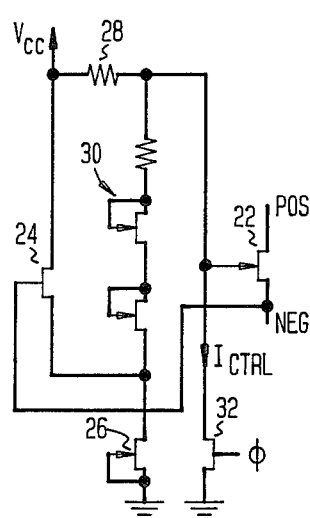
FIG. 1 is a schematic diagram of a known analog switch.

Use of a single current source (the transistor 12) which is not influenced by the control signal maintains a constant static current flow between $V_{dd}$ and $V_{ss}$, regardless of the state of the analog switch element, and this significantly reduces power supply noise as compared with the circuit shown in FIG. 1. The current through the transistors 2 and 4 is substantially independent of switch state, resulting in reduced settling time and minimizing feedthrough into the signal path due to charging and discharging of the gate-source capacitance of the transistor 2.

It is preferred that the FIG. 2 switch be connected in the current path in the manner indicated by the labels IN and OUT, i.e. the IN terminal is connected to the signal source and the OUT terminal is connected to the device that receives the signal, such as a sample-and-hold or a comparator. The orientation is preferred because in the opposite orientation, with the gate of the transistor 2 connected to the input terminal, the potential at the gate of the transistor 2 changes as the potential of the input signal changes, and these changes in potential are coupled through the source of the transistor 2, the diode 14, and the diode string 18 to the gate of the transistor 6 and then capacitively to the output node, thus influencing the state of the transistor 6 and resulting in blow-by from input to output. In the case of the illustrated orientation, the potential at the gate of the transistor 2 remains essentially stable when the switch is open and changes in the potential of the input signal do not influence the state of the transistor 6.

The switch shown in FIG. 2 may be used to control high speed sampling of an input signal by a sample-and-hold or a comparator, for example in an analog-to-digital converter. One example of the use of the switch in such a comparator is shown in copending application Ser. No. 727,482, filed Apr. 26, 1985 and now abandoned, the disclosure of which is hereby incorporated by reference herein.

It will be appreciated that the present invention is not restricted to the specific switch circuit shown in FIG. 2, and that variations may be made therein without departing from the scope of the invention as defined in the appended claims, and equivalents thereof. For example, by appropriate shifting of potential levels the circuit may be implemented using enhancement-mode MESFETs (EFETs). The diodes shown in FIG. 2 could constitute diode-connected junction transistors, and the transistors 4 and 12 could be DFETs even if the transistors 2 and 6 were EFETs. The invention is particularly applicable to FETs in which forward biasing of the gate relative to the source would result in injection of charge into the controlled current path, so that it is desirable to avoid forward biasing of that junction. This problem would not arise in a MOS device, because the oxide layer isolates the gate from the substrate, but may arise in JFETs (whether the impurity that gives rise to the p-n junction is diffused or implanted) or in MESFETs.

I claim:

1. A switch circuit comprising:

a switch element having first and second controlled current terminals, and switch control terminal connected to a first node of the switch circuit and further connected through a resistive load element to a first reference potential source, for receiving control current from said first reference potential source, said switch element having a conductive state, in which current flows between the first controlled current terminal and the second controlled current terminal, and a non-conductive state, in which current flow between the first controlled current terminal and the second controlled current terminal is prevented, said switch element being placed in its conductive state when the potential at the switch control terminal bears a predetermined relation to the potential at at least one oif said first and second controlled current terminals, and being placed in its non-conductive state when the potential at the switch control terminal does not bear said predetermined relation to the potential at said at least one controlled current terminal, a follower device having a first follower terminal connected to said first reference potential source, a second follower terminal connected to the first controlled current terminal of the switch element and also having a third follower terminal, said follower device having the property that the potentials at its second and third follower terminals remain in substantially fixed relation when current is conducted through the device from the first follower terminal to the third follower terminal, a first unidirectionally-conductive element connected between the first node of the switch circuit and a second node of the switch circuit for conducting current into said second node of the switch circuit from the switch control terminal of the switch element, a second unidirectionally-conductive element connected between the third follower terminal and the second node of the switch circuit for conducting current into said second node of the switch circuit from said third follower terminal, at least one additional unidirectionally-conductive element connected anti-parallel to said first unidirectionally-conductive element between said first and second nodes of the switch circuit, a constant current source connected to a control current terminal, for delivering current to a second reference potential source, and current-steering means for connecting the constant current source selectively to the first node of the switch circuit, whereby the switch element is placed in its non-conductive state, or to the second node of the switch circuit, whereby the switch element is placed in its conductive state and the potential at the switch control terminal of the switch element is maintained in a fixed relation to that at the first controlled current terminal of the switch element by the action of the follower device.

2. A switch circuit according to claim 1, wherein the switch element is a FET whose source and drain constitute said first and second controlled current terminals and whose gate constitutes said switch control terminal.

3. A switch circuit according to claim 2, wherein the switch element is a MESFET.

4. A switch circuit according to claim 1, wherein said follower device is a FET whose drain, gate and source constitute its first, second and third follower terminals respectively.

5. A switch circuit according to claim 4, wherein the follower device is a MESFET.

6. A switch circuit according to claim 1, wherein said resistive load element is a FET having its drain connected to said first control current terminal and having its source and gate connected to the control terminal of the switch element.

7. A switch circuit according to claim 1, wherein the constant current source is a FET having its drain connected to the current-steering means and having its source and gate connected to the second control current terminal.

8. A switch circuit according to claim 1, wherein the current-steering means comprises first and second FETs having their drains connected to the first and second nodes respectively, having their sources connected to the constant current source, and having their gates connected to receive a control signal and the complement thereof.

9. A switch circuit according to claim 1, wherein the switch element, the follower device, the resistive load element, the constant current source and the current-steering means each comprise at least one DFET.

10. A switch circuit according to claim 6 wherein the FET is a MESFET.

11. A switch circuit according to claim 7 wherein the FET is a MESFET.

12. A switch circuit according to claim 8 wherein the first and second FETs comprise respective first and second MESFETs.

* * * * *